(12) United States Patent
Powrozek et al.

(10) Patent No.: US 9,324,892 B2
(45) Date of Patent: Apr. 26, 2016

(54) SOLAR PANEL SUPPORT WITH INTEGRATED BALLAST CHANNELS

(75) Inventors: Eric A. Powrozek, Warren, MI (US); Peter M. Szadyr, Lake Orion, MI (US); Mark F. Werner, LaSalle (CA)

(73) Assignee: Magna International Inc., Aurora, Ontario (CA)

( * ) Notice: Subject to any disclaimer, the term of this patent is extended or adjusted under 35 U.S.C. 154(b) by 350 days.

(21) Appl. No.: 13/885,071

(22) PCT Filed: Nov. 15, 2011

(86) PCT No.: PCT/CA2011/001268
§ 371 (c)(1),
(2), (4) Date: May 22, 2013

(87) PCT Pub. No.: WO2012/065251
PCT Pub. Date: May 24, 2012

(65) Prior Publication Data
US 2013/0228537 A1 Sep. 5, 2013

Related U.S. Application Data

(60) Provisional application No. 61/414,168, filed on Nov. 16, 2010.

(51) Int. Cl.
*A47B 91/00* (2006.01)
*H01L 31/042* (2014.01)
(Continued)

(52) U.S. Cl.
CPC ............ *H01L 31/0422* (2013.01); *B21D 53/02* (2013.01); *F24J 2/525* (2013.01); *F24J 2/5233* (2013.01); *H01L 31/0521* (2013.01); *H02S 20/00* (2013.01); *H02S 20/24* (2014.12); *F24J 2002/522* (2013.01); *F24J 2002/5277* (2013.01);
(Continued)

(58) Field of Classification Search
CPC .................. F24J 2002/5277; F24J 2002/5273; F24J 2002/5275; F24J 2/4638; F24J 2/5203; F24J 2/523
USPC ......... 248/346.03; 126/57; 52/173.3, 64, 641, 52/645; 136/244
See application file for complete search history.

(56) References Cited

U.S. PATENT DOCUMENTS 4,226,256 A * 10/1980 Hawley .......................... 136/244
4,421,943 A * 12/1983 Withjack ...................... 136/246
(Continued)

FOREIGN PATENT DOCUMENTS

EP     1783440 A2   5/2007
FR     2494408 A1   5/1982
(Continued)

*Primary Examiner* — Kimberly Wood
(74) *Attorney, Agent, or Firm* — Dickinson Wright PLLC

(57) ABSTRACT

A solar panel support sub-assembly includes a bottom rail, a first top rail and a second top rail, each rail having first and second longitudinally opposite ends. The first end of the bottom rail is pivotally coupled to the first end of the first top rail and the second end of the bottom rail is pivotally coupled to the first end of the second top rail. The sub-assembly also includes a ballast rail having a first end that is pivotally coupled to the bottom rail at a first location intermediate the first and second longitudinally opposite ends of the bottom rail. The sub-assembly may be unfolded for assembly by pivoting the first and second top rails within a first plane and pivoting the ballast rail within a second plane that is normal to the first plane.

19 Claims, 16 Drawing Sheets

(51) Int. Cl.
*F24J 2/52* (2006.01)
*H01L 31/052* (2014.01)
*B21D 53/02* (2006.01)
*H02S 20/24* (2014.01)

(52) U.S. Cl.
CPC .......... *F24J 2002/5292* (2013.01); *Y02E 10/47* (2013.01); *Y02E 10/50* (2013.01); *Y10T 29/49355* (2015.01)

(56) References Cited

U.S. PATENT DOCUMENTS

| | | |
|---|---|---|
| 4,452,234 A | 6/1984 | Withjack |
| 6,046,399 A | 4/2000 | Kapner |
| 6,809,251 B2 * | 10/2004 | Dinwoodie .................. 136/251 |
| 8,726,897 B2 * | 5/2014 | Wallgren ...................... 126/571 |
| 2002/0033436 A1 * | 3/2002 | Peng et al. ................. 248/284.1 |
| 2007/0151594 A1 | 7/2007 | Mascolo et al. |
| 2008/0210221 A1 * | 9/2008 | Genschorek ................. 126/704 |
| 2009/0302183 A1 | 12/2009 | Strizki |
| 2010/0236183 A1 | 9/2010 | Cusson et al. |
| 2010/0269446 A1 | 10/2010 | Merrifield |
| 2012/0186632 A1 * | 7/2012 | Reinhold et al. .............. 136/251 |

FOREIGN PATENT DOCUMENTS

| | | |
|---|---|---|
| FR | 2890725 A1 | 3/2007 |
| JP | 2008208554 A | 9/2008 |
| WO | 2009114730 A2 | 9/2009 |

* cited by examiner

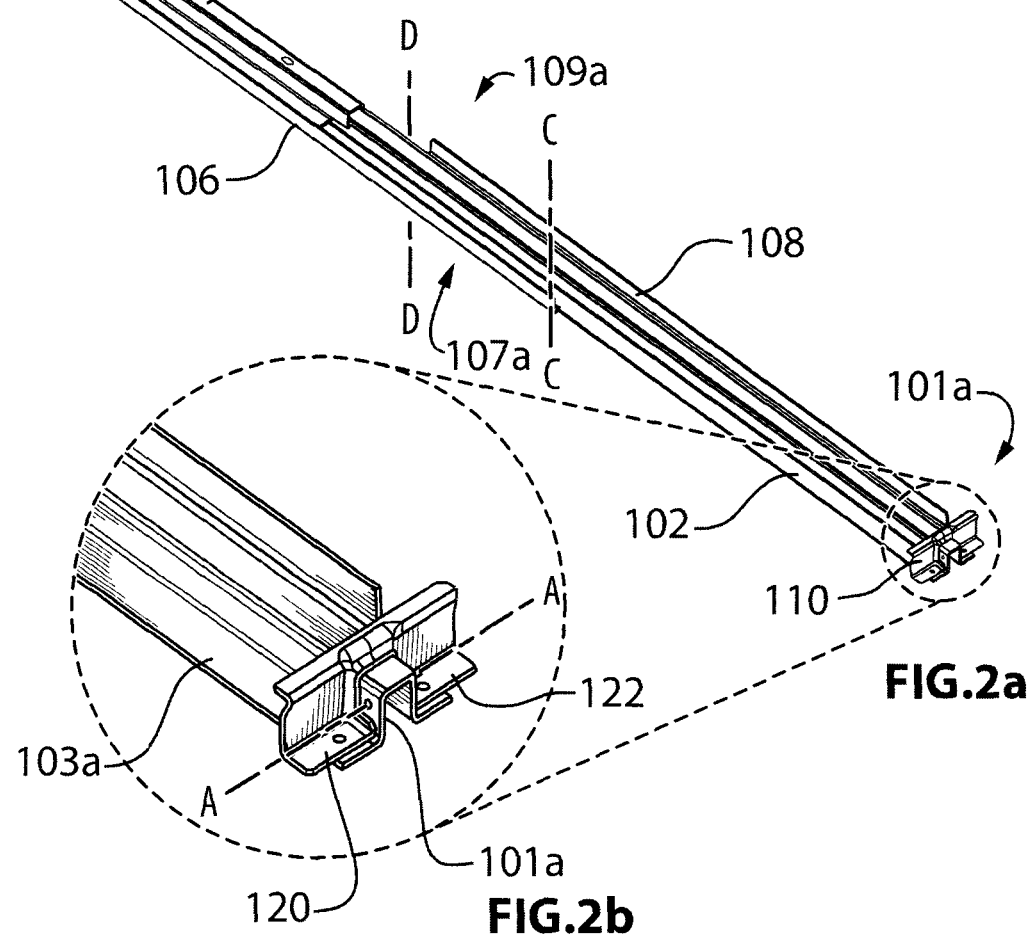

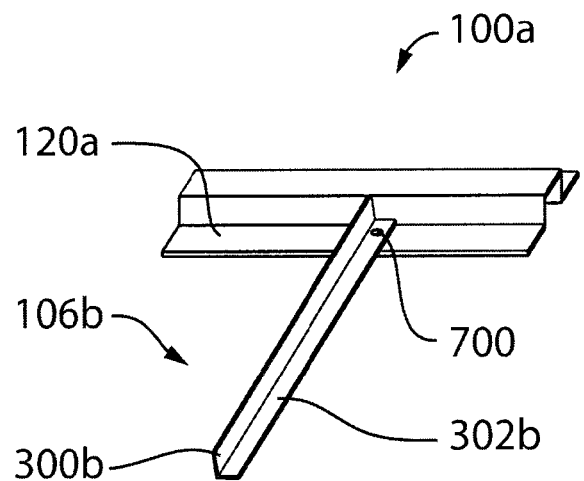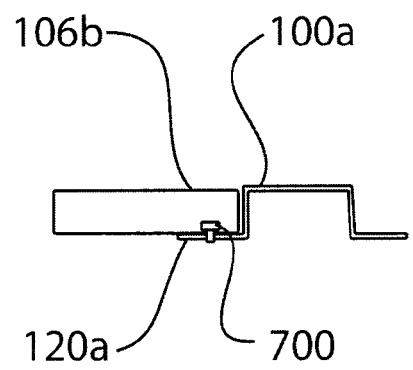
FIG.7a  FIG.7b
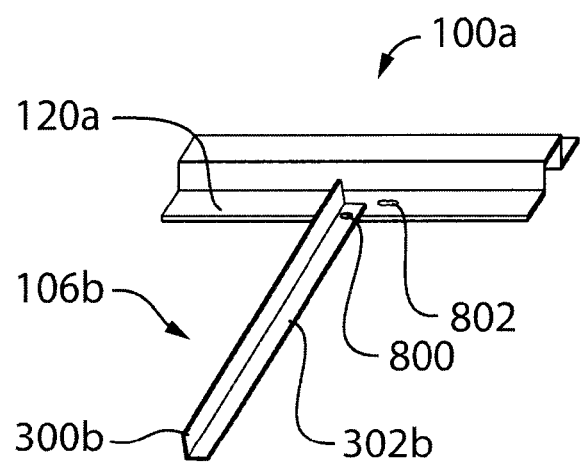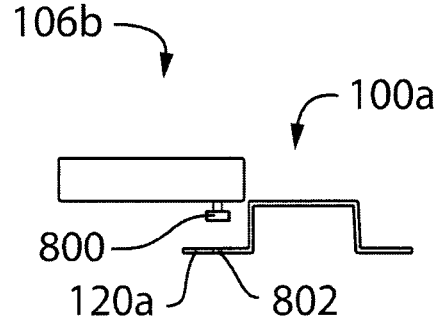
FIG.8a  FIG.8b
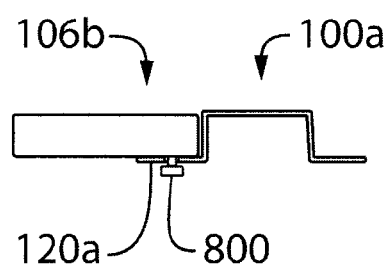
FIG.8c

SOLAR PANEL SUPPORT WITH INTEGRATED BALLAST CHANNELS

CROSS-REFERENCE TO RELATED APPLICATIONS

This U.S. National Stage Patent Application claims the benefit of International Application serial number PCT/CA2011/001268 filed Nov. 15, 2011 and U.S. Provisional Patent Application Ser. No. 61/414,168 filed Nov. 16, 2010, the entire disclosures of the applications being considered part of the disclosure of this application, and hereby incorporated by reference.

FIELD OF THE INVENTION

The instant invention relates generally to solar panel support systems, and more particularly to systems and methods for supporting photovoltaic panels or the like on rooftops or on other substantially level surfaces.

BACKGROUND OF THE INVENTION

Solar panels are being employed increasingly in the production of renewable energy for commercial and residential uses. It is already well established that mounting solar panels correctly is crucial to maximizing energy production, and is an important way to provide stability and to protect the solar panels from the effects of the natural elements.

Various support systems are known for mounting solar panels on rooftops, ground racks or tracking units. Typically, these support systems are costly, labor intensive to install, heavy, structurally inferior and mechanically complicated. It is particularly disadvantageous that most existing support systems require meticulous on-site assembly of multiple parts, performed by expensive field labor. Of course, the on-site assembly work is often performed in unfavorable working conditions, i.e. in harsh or inclement weather. As a result, misalignment of the overall support assembly often occurs, which can jeopardize the supported solar panels or other supported devices.

Even a stable, flat roof presents problems for the mounting of an array of solar panels. For instance, it is necessary to avoid any damage to the roof while securing a panel array that can be quite elaborate, and the stresses that are permitted on the roof structure itself must also be considered. Therefore, a need exists for a low-cost, uncomplicated, and structurally strong support system and assembly method. A need also exists for a support system that achieves a precise configuration in the field without requiring extensive, specialized work at the installation site. Further, a need exists for a support system with a shipping configuration that allows the system to be easily handled in transit, while still facilitating rapid deployment at the installation site.

One attempt to provide such a support system is presented by Harberts et al. in United States Patent Application Publication 2010/0236183. In particular, Harberts et al. disclose a modular racking system for solar panels. The racking system includes a plurality of discreet ballast holders and a plurality of panel support members, each panel support member having two upright members of non-equal length and a transverse portion connecting together the two upright members. The relative heights of the two upright members define an inclination angle of the transverse portion, at which angle the solar panel is to be supported relative to the roof surface. Ballast material is removably positioned in more than one of the discrete ballast holders, and each discrete ballast holder is connected to no more than four of the panel support members. In this way, ballast material is positioned in front of and behind each supported solar panel, wherein the ballast material that is positioned between two adjacent rows of supported solar panels serves to anchor the rack modules in each of the two rows. Unfortunately, it is a limitation of the system that is described by Harberts et al. that the minimum spacing between the two adjacent rows of supported solar panels is dictated by the configuration of the ballast holders and by the size and height of the ballast material itself. As a result, even when the inclination angle is very shallow, it is still necessary to maintain a substantial spacing between the photovoltaic panels of the two rows.

It would be advantageous to provide a system and method that overcomes at least some of the above-mentioned limitations of the prior art.

SUMMARY OF EMBODIMENTS OF THE INVENTION

According to an aspect of at least one embodiment of the instant invention a solar panel support sub-assembly, is provided, comprising: a bottom rail having a first length extending between first and second longitudinally opposite ends thereof; a first top rail having a second length extending between first and second longitudinally opposite ends thereof, the first end of the first top rail pivotally coupled to the first end of the bottom rail for supporting a pivoting movement of the first top rail between a folded condition and an unfolded condition; a second top rail having a third length extending between first and second longitudinally opposite ends thereof, the first end of the second top rail pivotally coupled to the second end of the bottom rail for supporting a pivoting movement of the second top rail between a folded condition and an unfolded condition; and, a ballast rail having a first end that is pivotally coupled to the bottom rail at a first location intermediate the first and second longitudinally opposite ends of the bottom rail for supporting a pivoting movement of the ballast rail between a folded condition and an unfolded condition; wherein the first and second top rails pivot within a first plane and the ballast rail pivots within a second plane that is normal to the first plane.

According to an aspect of at least one embodiment of the instant invention, a solar panel support system is provided, comprising: a first solar panel support sub-assembly and a second solar panel support sub-assembly, each comprising: a bottom rail having a first length extending between first and second longitudinally opposite ends thereof; a first top rail having a second length extending between first and second longitudinally opposite ends thereof, the first end of the first top rail pivotally coupled to the first end of the bottom rail for supporting a pivoting movement of the first top rail between a folded condition and an unfolded condition; a second top rail having a third length extending between first and second longitudinally opposite ends thereof, the first end of the second top rail pivotally coupled to the second end of the bottom rail for supporting a pivoting movement of the second top rail between a folded condition and an unfolded condition; and, a ballast rail having a first end that is pivotally coupled to the bottom rail at a location intermediate the first and second longitudinally opposite ends of the bottom rail for supporting a pivoting movement of the ballast rail between a folded condition and an unfolded condition; wherein the first and second top rails pivot within a first plane and the ballast rail pivots within a second plane that is normal to the first plane, and wherein the second end of the first top rail is fixedly secured to the second end of the second top rail when the solar panel support sub-assembly is in an assembled condition, and wherein, when the solar panel support system is in the assembled condition, the second end of the ballast rail of the first solar panel support sub-assembly is mechanically coupled to the bottom rail of the second solar panel support sub-assembly and the second end of the ballast rail of the second solar panel support sub-assembly is mechanically coupled to the bottom rail of the first solar panel support sub-assembly, said ballast rail of the first solar panel support sub-assembly cooperating with the ballast rail of the second solar panel support sub-assembly for receiving therebetween a ballast element.

According to an aspect of at least one embodiment of the instant invention, a solar panel support system is provided, comprising: a plurality of solar panel support sub-assemblies, including a first solar panel support sub-assembly, a second solar panel support sub-assembly, and a third solar panel support sub-assembly, each comprising: a collapsible triangular-shaped frame comprising a bottom rail, a first top rail and a second top rail; and, a first ballast rail that is pivotally coupled to the bottom rail at a first pivot location; and, at least one deflector element interconnecting the first and second solar panel support sub-assemblies and interconnecting the first and third solar panel support sub-assemblies, wherein the first solar panel support sub-assembly comprises a further rail that is pivotally coupled to the bottom rail at a second pivot location, the second pivot location spaced apart from the first pivot location; and, wherein, in an assembled condition, a non-pivotally coupled end of the first ballast rail of the first solar panel support sub-assembly is fixedly secured to the bottom rail of the second solar panel support sub-assembly and a non-pivotally coupled end of the further rail of the first solar panel support sub-assembly is fixedly secured to the bottom rail of the third solar panel support sub-assembly, the second and third solar panel support sub-assemblies being disposed one each on opposite sides of the first solar panel support sub-assembly.

According to an aspect of at least one embodiment of the instant invention, a method for supporting a solar panel is provided, comprising: providing a pre-assembled first solar panel support sub-assembly and a pre-assembled second solar panel support sub-assembly, each comprising a bottom rail, a first top rail pivotally coupled to a first end of the bottom rail, a second top rail pivotally coupled to a second end of the bottom rail that is opposite the first end, and a first ballast rail pivotally coupled to the bottom rail at a first location intermediate the first and second ends; fixedly securing a free end of the first top rail to a free end of the second top rail of each of the first and second solar panel support sub-assemblies; pivoting the first ballast rail of the first solar panel support sub-assembly away from the bottom rail thereof and pivoting the first ballast rail of the second solar panel support sub-assembly away from the bottom rail thereof; coupling a free end of the first ballast rail of the first solar panel support sub-assembly to the bottom rail of the second solar panel support sub-assembly and coupling a free end of the first ballast rail of the second solar panel support sub-assembly to the bottom rail of the first solar panel support sub-assembly; positioning a ballast element in contact with at least a portion of the first ballast rail of the first solar panel support sub-assembly and in contact with at least a portion of the first ballast rail of the second solar panel support sub-assembly; and, securing the solar panel adjacent to an upper surface of the first top rail of the first and second solar panel support sub-assemblies.

BRIEF DESCRIPTION OF THE DRAWINGS

Exemplary embodiments of the invention will now be described in conjunction with the following drawings, in which:

FIG. 1b is an end view showing the hat-shaped profile of the bottom rail, the first top rail and the second top rail of the solar panel support sub-assembly of FIG. 1a;

FIG. 2a shows the solar panel support sub-assembly of FIG. 1 with the bottom rail, the first top rail and the second top rail in a nested-together stacked configuration;

FIG. 2b is an enlarged view showing detail of the first end of the first top rail pivotally coupled to the first end of the bottom rail;

FIG. 2c is an enlarged view showing detail of the first end of the second top rail pivotally coupled to the second end of the bottom rail;

FIG. 3b shows enlarged detail within the dashed-line circle of FIG. 3a;

FIG. 7a is a perspective view showing enlarged detail within the dashed circle of FIG. 5, in which the free end of the second ballast rail of one solar panel support sub-assembly is fixedly secured to the bottom rail of the other solar panel support sub-assembly via a rivet;

FIG. 7b is a simplified end view showing the second ballast rail of one solar panel support sub-assembly fixedly secured to the bottom rail of the other solar panel support sub-assembly via a rivet;

FIG. 8a is a perspective view showing enlarged detail within the dashed circle of FIG. 5, in which a key hole latch mechanism is provided instead of a rivet for securing the free end of the second ballast rail of one solar panel support sub-assembly to the bottom rail of the other solar panel support sub-assembly;

FIG. 8b is a simplified end view showing a button at one end of the second ballast rail of one solar panel support sub-assembly aligned with a keyhole-shaped slot of the bottom rail of the other solar panel support sub-assembly;

FIG. 8c is a simplified end view showing the button at one end of the second ballast rail of one solar panel support sub-assembly in an engaged condition within the keyhole-shaped slot of the bottom rail of the other solar panel support sub-assembly;

FIG. 12b is an end view showing the hat-shaped profile of any of the bottom rail, the first top rail and the second top rail of the west solar panel support sub-assembly of FIG. 12a;

FIG. 12c is an end view showing the hat-shaped profile of any of the bottom rail, the first top rail and the second top rail of the east solar panel support sub-assembly of FIG. 12a;

FIG. 16b is a top view of the system of FIG. 16a; and,

FIG. 16c is a rear view of the system of FIG. 16a.

DETAILED DESCRIPTION OF EMBODIMENTS OF THE INVENTION

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the invention. Thus, the present invention is not intended to be limited to the embodiments disclosed, but is to be accorded the widest scope consistent with the principles and features disclosed herein.

Figure 1A:
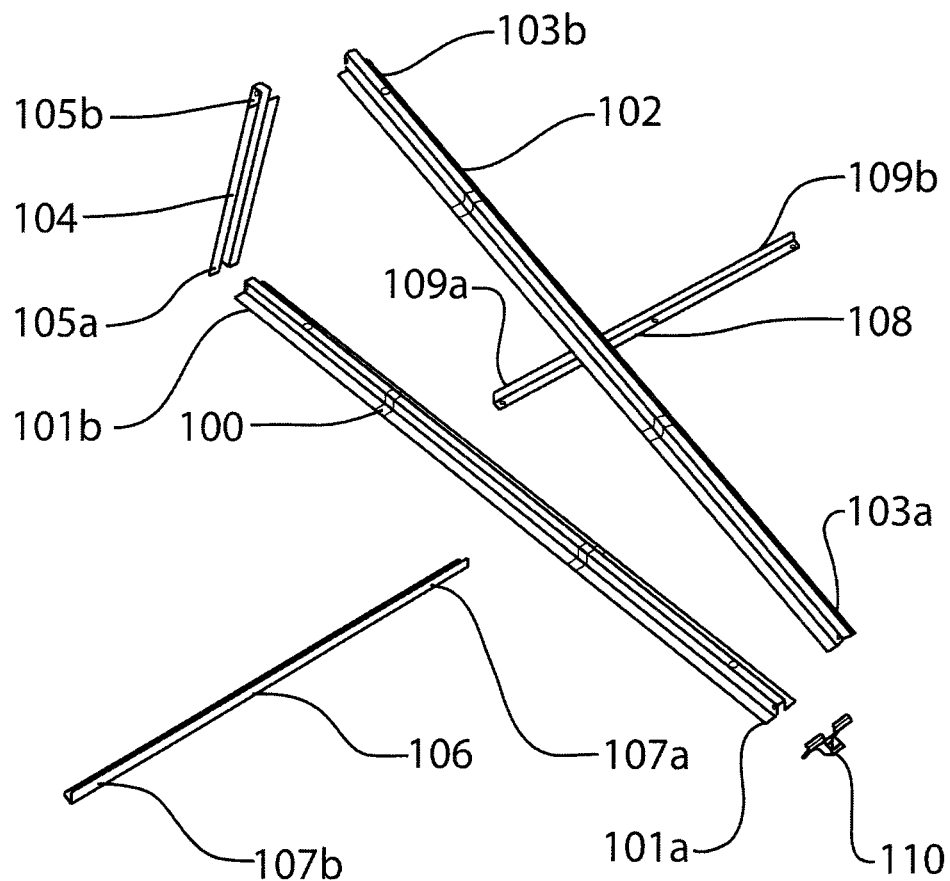
FIG. 1a is an exploded view of a solar panel support sub-assembly, according to an embodiment of the instant invention.

Referring to FIG. 1a, shown is an exploded view of a solar panel support sub-assembly, according to an embodiment of the instant invention. The solar panel support sub-assembly comprises: a bottom rail 100 having a first length extending between first and second longitudinally opposite ends thereof, 101a and 101b, respectively; a first top rail 102 having a second length extending between first and second longitudinally opposite ends thereof, 103a and 103b, respectively; and, a second top rail 104 having a third length extending between first and second longitudinally opposite ends thereof, 105a and 105b, respectively. As is shown in FIG. 1a, the third length is shorter than the second length, and the second length is shorter than the first length. Further, a retaining member 110, such as for instance a clip, is provided for supporting a not illustrated solar panel in a mounted configuration adjacent to an upper surface of the first top rail 102.

Figure 1B:
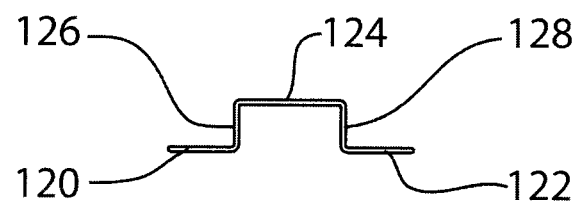

In the instant example, the bottom rail 100, the first top rail 102 and the second top rail 104 are hat-shaped beams. As is shown most clearly in FIG. 1b, each one of the bottom rail 100, the first top rail 102 and the second top rail 104 includes first and second side flanges 120 and 122, respectively, joined to a central flange 124 via first and second webs 126 and 128, respectively. The central flange 124 or the first and second side flanges 120 and 122 provide upper surfaces along the first top rail 102, for supporting a not illustrated solar panel as described in greater detail in the following sections.

Referring again to FIG. 1a, the solar panel support sub-assembly comprises a ballast rail 106 and a further rail 108. In the instant example, the ballast rail 106 is a first ballast rail and the further rail 108 is a second ballast rail. The ballast rail 106 has a first end 107a and a second end 107b, and the further rail 108 has a first end 109a and a second end 109b. A length of the ballast rail 106 is substantially identical to a length of the further rail 108.

Referring now to FIGS. 2a-c, shown are various views of the solar panel support sub-assembly of FIG. 1a in a folded condition. As is shown most clearly in FIG. 2b, the first end 103a of the first top rail 102 is pivotally coupled to the first end 101a of the bottom rail 100, thereby supporting a pivoting movement of the first top rail 102 relative to the bottom rail 100 about the axis A-A. By way of a specific and non-limiting example, the first top rail 102 is pivotally coupled to the bottom rail 100 by riveting the first web 126 at the first end 103a of the first top rail 102 to the first web 126 at the first end 101a of the bottom rail 100, and by riveting the second web 128 at the first end 103a of the first top rail 102 to the second web 128 at the first end 101a of the bottom rail 100. The same rivets that couple together the first top rail 102 and bottom rail 100 also fixedly secure the retaining member 110 to the first end 103a of the first top rail 102.

In a similar manner, as shown most clearly in FIG. 2c, the first end 105a of the second top rail 104 is pivotally coupled to the second end 101b of the bottom rail 100, thereby supporting a pivoting movement of the second top rail 104 relative to the bottom rail 100 about the axis B-B. Again, by way of a specific and non-limiting example, the second top rail 104 is pivotally coupled to the bottom rail 100 by riveting the first web 126 at the first end 105a of the second top rail 104 to the first web 126 at the second end 101b of the bottom rail 100, and by riveting the second web 128 at the first end 105a of the second top rail 104 to the second web 128 at the second end 101b of the bottom rail 100. Alternatively, mechanical fasteners other than rivets are used to pivotally couple the first top rail 102 and/or the second top rail 104 to the bottom rail 100.

Referring again to FIG. 2a, the first end 107a of the ballast rail 106 is pivotally coupled to the bottom rail 100 at a first location between the first and second longitudinally opposite ends thereof, 101a and 101b, respectively. By way of a specific and non-limiting example, the first end 107a of the ballast rail 106 is riveted to the first side flange 120 of the bottom rail 100, such that ballast rail 106 is pivotally moveable about the axis C-C, which passes through said first location. Similarly, the first end 109a of the further rail 108 is pivotally coupled to the bottom rail 100 at a second location between the first and second longitudinally opposite ends thereof, 101a and 101b, respectively. By way of a specific and non-limiting example, the first end 109a of the further rail 108 is riveted to the second side flange 122 of the bottom rail 100, such that further rail 108 is pivotally moveable about the axis D-D, which passes through the second location. The axes A-A and B-B are substantially parallel one relative to the other, and the axes C-C and D-D are substantially parallel one relative to the other. At the same time, the axes A-A and B-B are both substantially normal to the axes C-C and D-D. As such, the first and second top rails 102 and 104 each pivot within a first plane, and the ballast rail 106 and the further rail 108 each pivot within a second plane that is substantially normal to the first plane.

When the solar panel support sub-assembly is in the folded condition, as shown in FIG. 2a, the bottom rail 100, the first top rail 102 and the second top rail 104 are disposed in a nested-together stacked configuration, and the ballast rail 106 and the further rail 108 are pivoted inwardly toward the bottom rail 100. The folded condition of the solar panel support sub-assembly facilitates shipping, storage and handling.

Figure 3B:
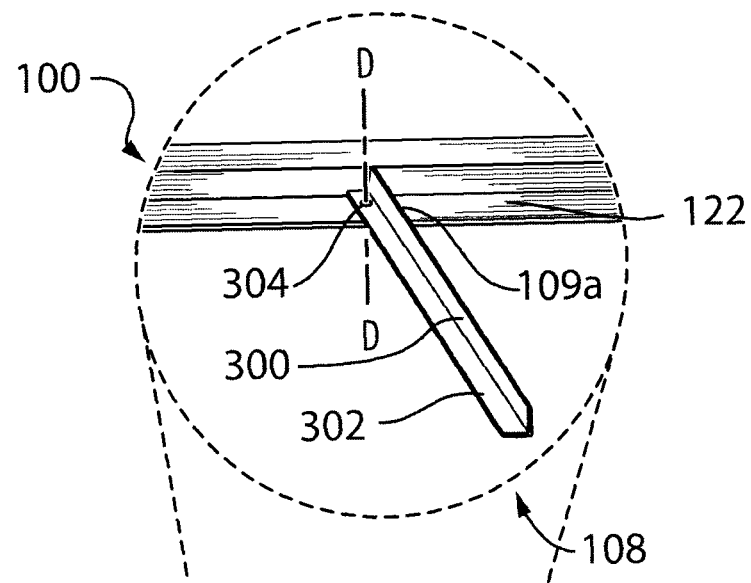
Figure 3A:
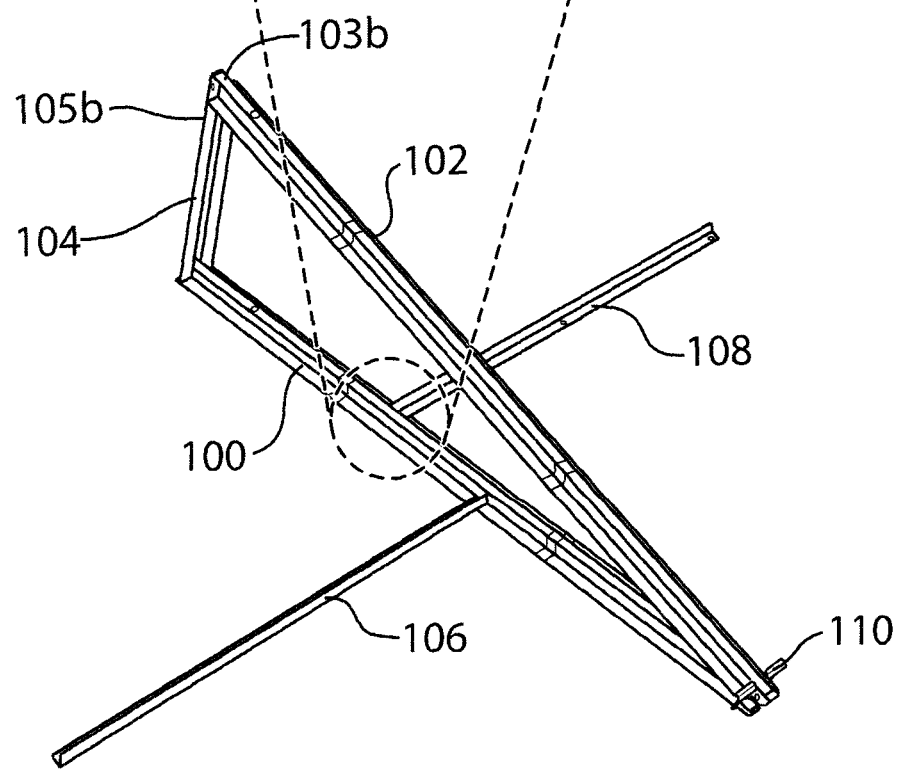
FIG. 3a shows the solar panel support sub-assembly of FIG. 1a in an assembled condition, and with the non-pivotally coupled end of the first top rail fixedly secured to the non-pivotally coupled end of the second top rail.

Referring now to FIG. 3a, shown is the solar panel sub-assembly of FIG. 1a in a fully unfolded condition. As shown in FIG. 3a, the second end 105b of the second top rail 104 is fixedly secured to the second end 103b of the first top rail 102, so as to form a rigid, triangular-shaped frame. Referring now to FIG. 3b, shown is an enlarged detail view of the attachment of the further rail 108 to the bottom rail 100. As is shown most clearly in FIG. 3b, the further rail 108 is generally L-shaped when viewed in a cross section that is taken in a plane normal to the length thereof. The further rail 108 comprises an upright portion 300 for substantially preventing horizontal movement of a not illustrated ballast element, and a flange 302 extending away from the upright portion 300 for engaging a lower surface of the not illustrated ballast element. A mechanical fastener, such as for instance a rivet 304 passing through flange 302 and second side flange 122, pivotally couples the further rail 108 to the bottom rail 100. Ballast rail 106 is substantially the same shape as further rail 108, and is pivotally coupled to the first side flange 120 of bottom rail 100 in a manner similar to that described above with reference to the further rail 108.

Figure 4:
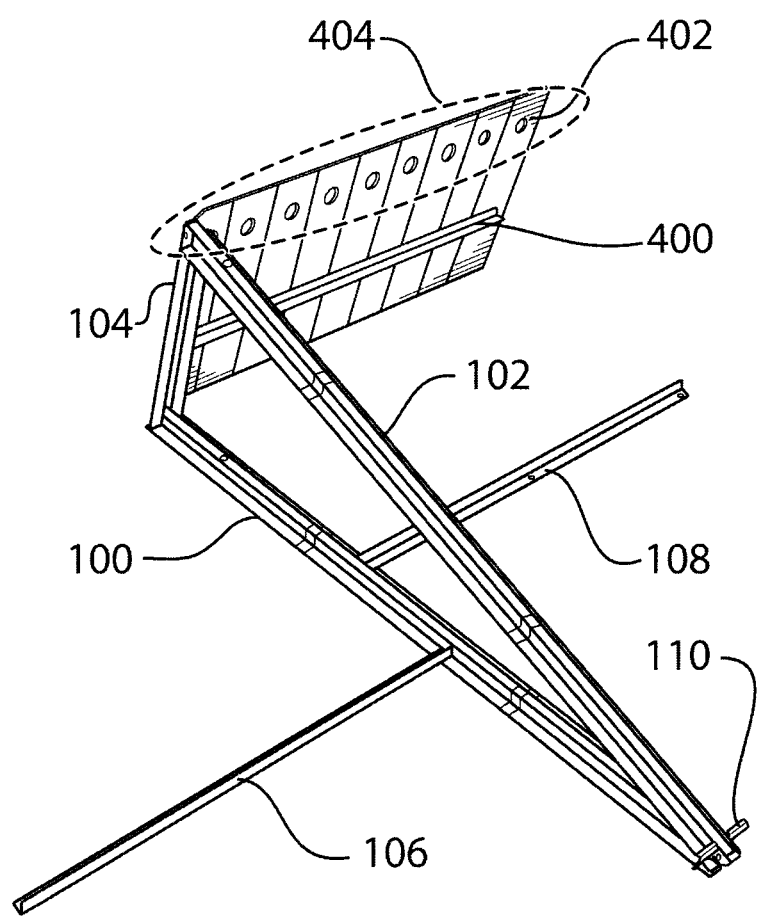
FIG. 4 shows the solar panel support sub-assembly of FIG. 1a in an assembled condition, with the non-pivotally coupled end of the first top rail fixedly secured to the non-pivotally coupled end of the second top rail, and with a back support rail and deflector element coupled to the second top rail.

Referring now to FIG. 4, shown is the solar panel sub-assembly of FIG. 1a in a fully unfolded condition, and with a back support rail 400 and a deflector element 402 coupled to the second top rail 104. In the example that is shown in FIG. 4, the deflector element 402 includes a vertically oriented stiffening bead structure and the back support rail 400 is substantially identical to both the ballast rail 106 and the further rail 108. Optionally, the deflector element 402 includes a horizontally oriented stiffening bead structure. Further optionally, the stiffening bead structure is omitted. Still further optionally, the back rail 400 has another suitable profile, such as for instance a hat-shaped profile.

Referring still to FIG. 4, a plurality of ventilation structures, such as for instance the plurality of substantially circular openings 404, optionally is defined within a portion of the deflector element 402. When a photovoltaic panel is supported on the solar panel sub-assembly, the ventilation structures make it possible for a flow of air to circulate under the photovoltaic panel and thereby cool the photovoltaic panel, which results in higher efficiency operation of the photovoltaic panel.

Figure 5:
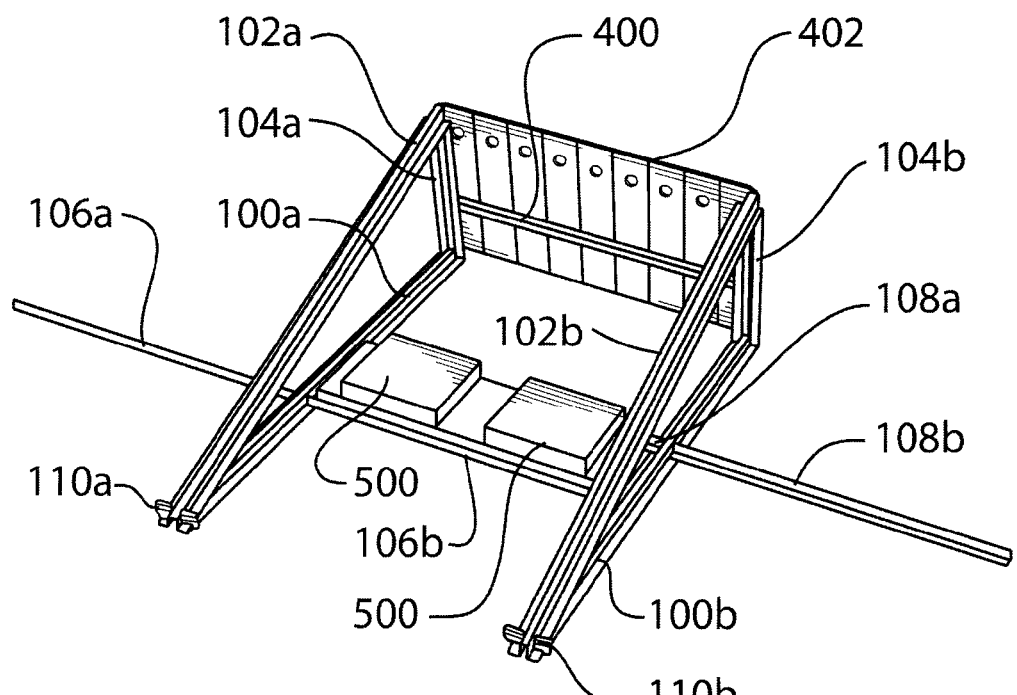
FIG. 5 is a perspective view of a solar panel support system for supporting a solar panel in a portrait orientation, shown without a solar panel installed.

FIG. 5 is a perspective view of a solar panel support system for supporting a solar panel in a portrait orientation, shown without a solar panel installed, in which two solar panel support sub-assemblies (sub-assembly "a" and sub-assembly "b") are coupled together. In particular, the further rail 108a of sub-assembly "a" is mechanically coupled to the bottom rail 100b of sub-assembly "b," and the ballast rail 106b of sub-assembly "b" is mechanically coupled to the bottom rail 100a of sub-assembly "a." The mechanical coupling is performed, for instance, by riveting as illustrated in FIGS. 7a and 7b. In this case, a rivet 700 pivotally couples together the flange 302b projecting from the upright portion 300b of the ballast rail 106b and the first side flange 120a of bottom rail 100a. Alternatively, the mechanical coupling is performed using a mechanical latching mechanism as shown in FIGS. 8a-8c. In the specific and non-limiting example that is shown in FIGS. 8a-8c, a button-and-keyhole type mechanism is employed, whereby a button 800 projecting from a lower surface of the flange 302b of the ballast rail 106b is aligned with and received within a keyhole-shaped slot 802 in the first side flange 120a of the bottom rail 100a.

Figure 8D:
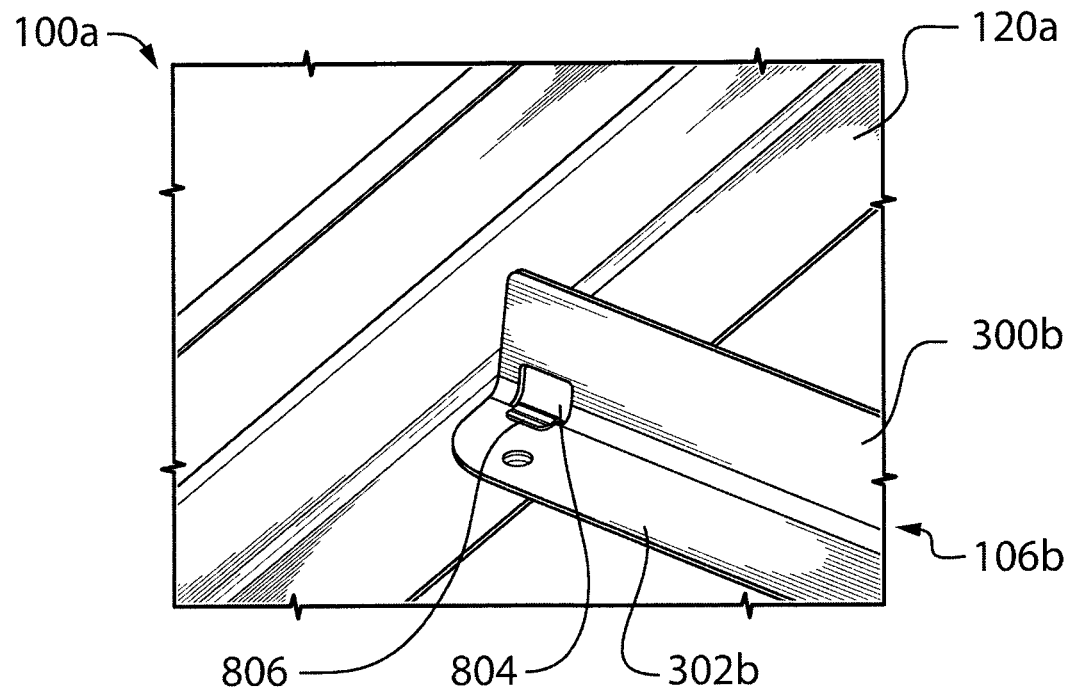
FIG. 8d is a perspective view showing enlarged detail within the dashed circle of FIG. 5, in which a tab-and-slot latching mechanism is provided instead of a rivet for securing the free end of the second ballast rail of one solar panel support sub-assembly to the bottom rail of the other solar panel support sub-assembly.
Figure 8E:
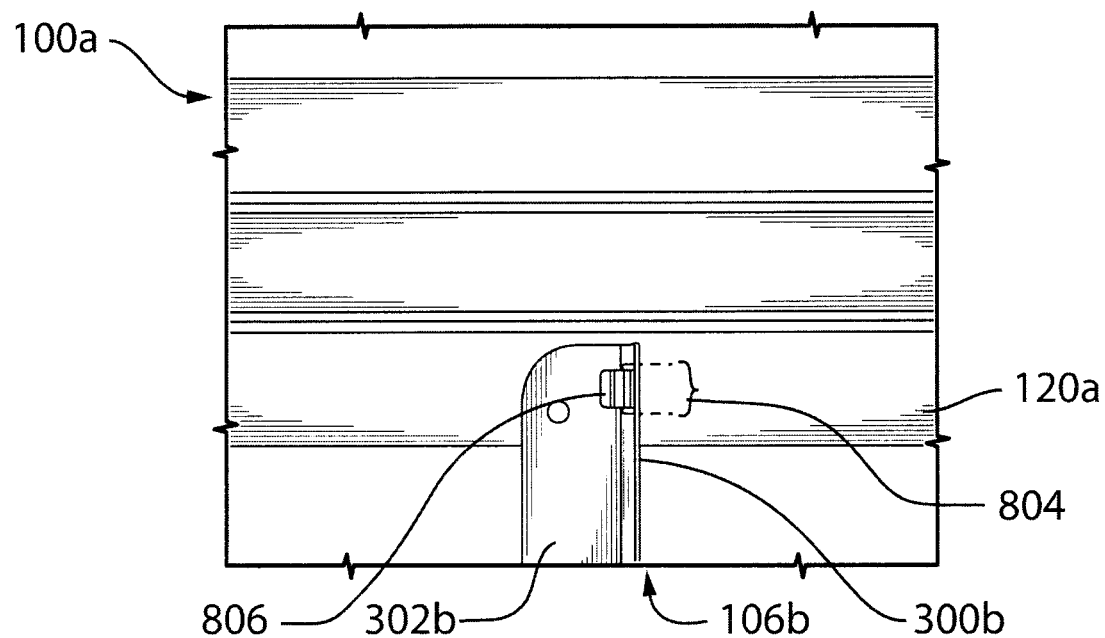
FIG. 8e is a top view of the tab-and-slot latching mechanism of FIG. 8d.

Optionally, a different type of latching mechanism is employed for achieving the mechanical coupling, such as for instance a tab-and-slot mechanism as illustrated in FIGS. 8d and 8e. FIG. 8d is a perspective view showing a tab-and-slot mechanism that is suitable for achieving mechanical coupling. The tab-and-slot mechanism includes a raised tab 806 projecting from the first side flange 120a of the bottom rail 100a. The raised tab 806 slidingly engages a slot 804 that is defined within the upright portion 300b of the ballast rail 106b. FIG. 8e is a top view of the tab-and-slot mechanism of FIG. 8d, showing the tab 806 and the slot 804 in an engaged condition. Optionally, the slot 804 is defined within the flange 302b for receiving the tab 806.

When the mechanical coupling is achieved using either the button-and-keyhole type mechanism or the tab-and-slot type mechanism described above, then ballast elements 500 (e.g., 2-inch by 12-inch by 12-inch concrete slabs) that are disposed between the L-shaped ballast rail 106b and the L-shaped further rail 108a prevent movement of the rails, which could result in decoupling of the latching features. Thus, positioning the ballast elements as shown in FIG. 5 prevents movement of the button feature 800 out of the keyhole shaped slot 802, or prevents movement of the tab 806 out of the slot 804.

When the solar panel support system is in the assembled condition, as shown in FIG. 5, the L-shaped ballast rail 106b and the L-shaped further rail 108a cooperate to receive therebetween the above-mentioned ballast elements 500, which in the instant example are illustrated as 2-inch by 12-inch by 12-inch concrete slabs. The upright portions of the ballast rail 106b and of the further rail 108a prevent horizontal movement of the ballast elements, whilst the flanges extending from the upright portions engage the lower surfaces of the ballast elements.

Referring still to FIG. 5, solar panel support sub-assembly "a" and solar panel support sub-assembly "b" are also coupled together via the deflector element 402. In the instant example, the deflector element is fixedly secured to the second top rail 104a using two rivets and is fixedly secured to the second top rail 104b using an additional two rivets. The deflector element 402 inhibits air-movement through the solar panel support system, thereby reducing the risk of the solar panel being lifted by gusts of wind.

Figure 6A:
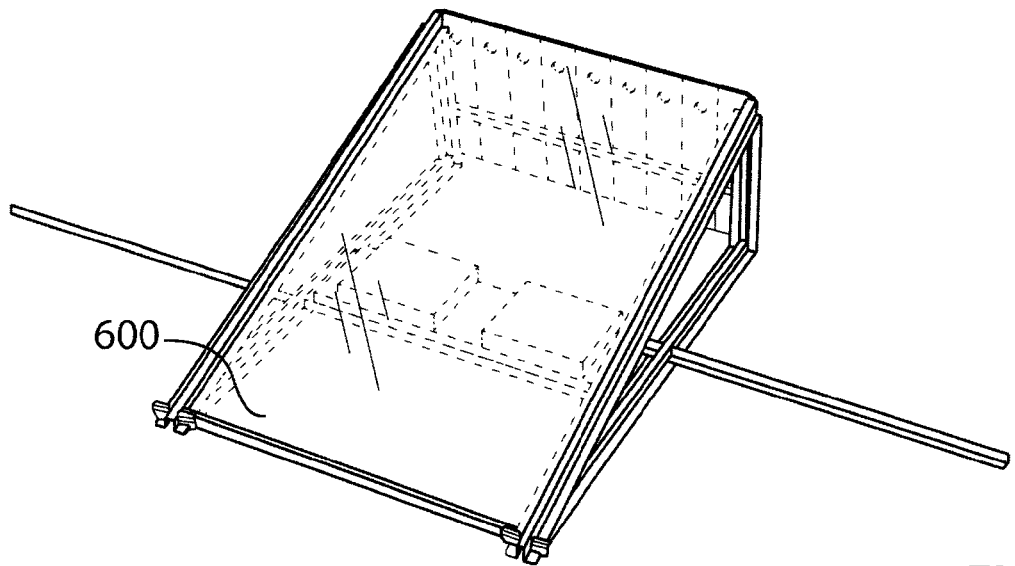
FIG. 6a is a perspective view of the solar panel support system of FIG. 5, shown with a solar panel supported in a portrait orientation.
Figure 6B:
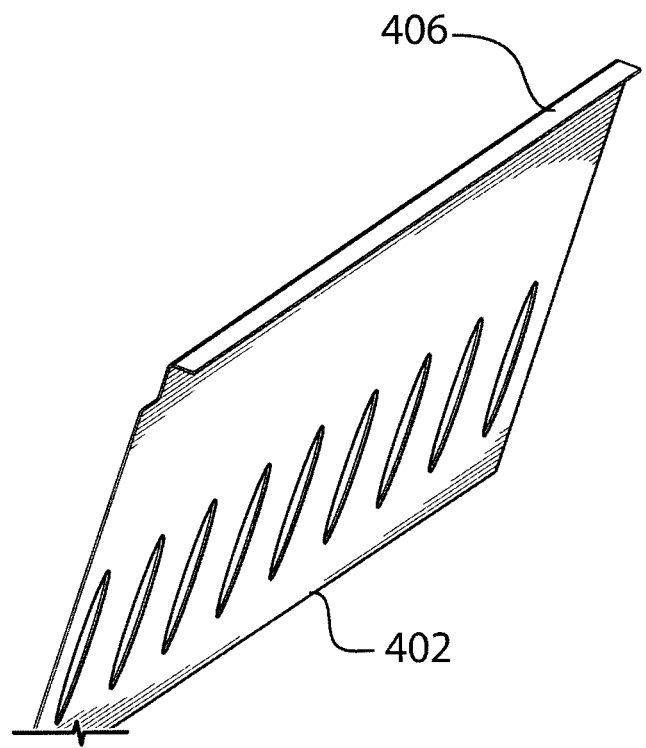
FIG. 6b is a perspective view showing enlarged detail of the upper edge of the deflector element including a lip or retaining flange for securing a photovoltaic panel in a mounted condition.
Figure 6C:
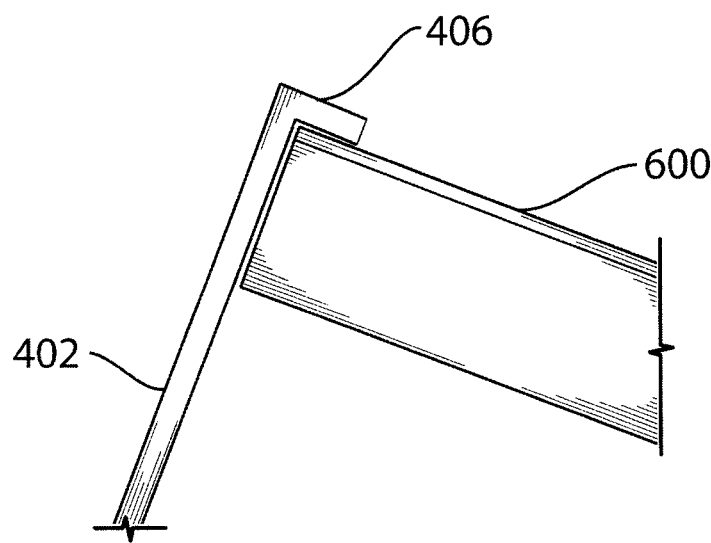
FIG. 6c is a side view showing enlarged detail of the upper edge of the deflector element including a lip or retaining flange for securing a photovoltaic panel in a mounted condition.
Figure 9:
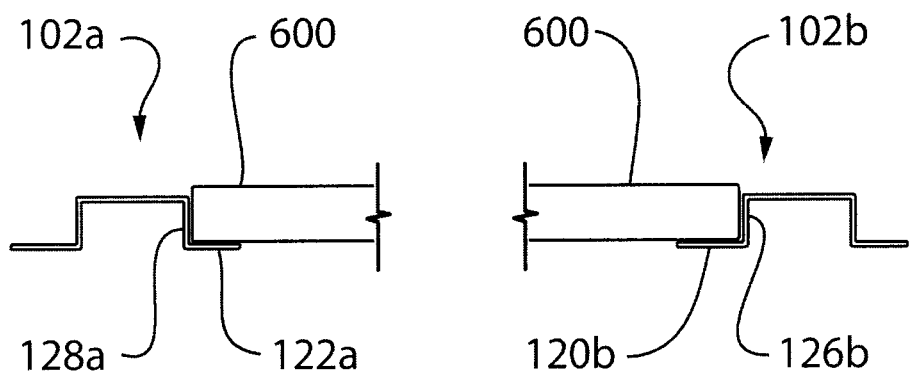
FIG. 9 is a simplified, partial end view showing a solar panel mounted in a portrait orientation adjacent to the first top rails of a solar panel support system according to an embodiment of the instant invention.

Referring now to FIG. 6a, shown is a perspective view of the solar panel support system of FIG. 5, with a solar panel 600 supported in a portrait orientation. Referring also to FIG. 9, the solar panel 600 is supported in the portrait orientation with one edge portion of the panel 600 engaging the second side flange 122a of the first top rail 102a of sub-assembly "a," and with an opposite edge portion of the panel 600 engaging the first side flange 120b of the first top rail 102b of sub-assembly "b." The retaining member 110, which is mounted at the first end of each first top rail 102a and 102b, is omitted from FIG. 9 for improved clarity. Lateral movement of the solar panel 600 is restricted by the second web 128a and by the first web 126b of the first top rails 102a and 102b, respectively. Further, as is shown in FIGS. 6b and 6c, a lip or retaining flange 406 is defined along the upper edge of the deflector element 402 for securing the solar panel in the support system. Alternatively, another suitable retaining structure is provided for securing the solar panel in the support system.

Figure 11:
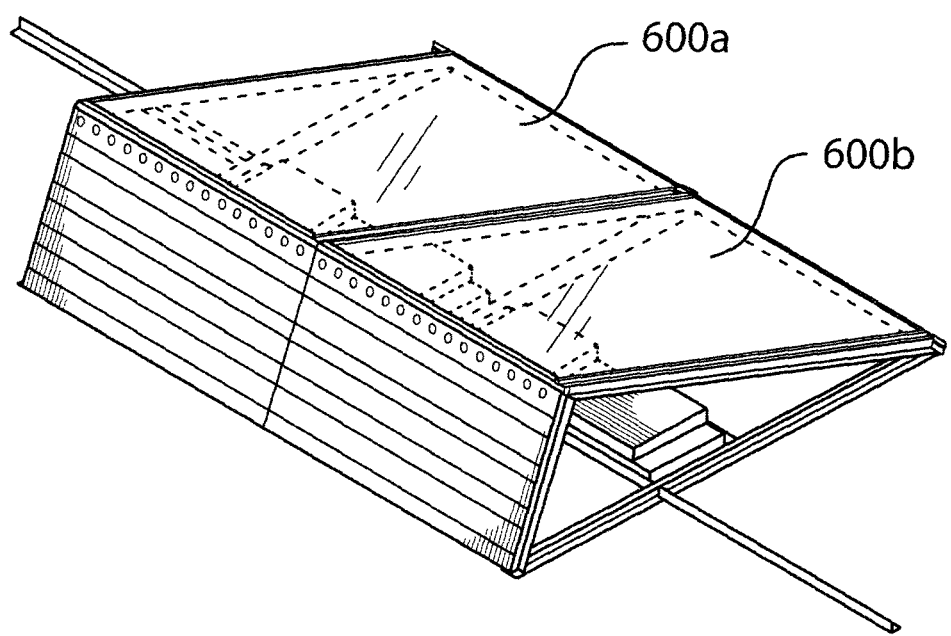
FIG. 11 is a perspective view of an extended solar panel support system, shown with a plurality of solar panels each supported in a portrait orientation.

Referring now to FIG. 11, shown is a rear perspective view of an extended solar panel support system, shown with a plurality of solar panels 600a and 600b, each being supported in the portrait orientation format. Three solar panel support sub-assemblies, described above with reference to FIGS. 1-4, are coupled together in a manner analogous to that described above with reference to FIGS. 5-9. Of course, each additional solar panel support sub-assembly that is coupled to the system of FIG. 11 supports one additional solar panel.

Assembly of the solar panel support system shown in FIGS. 5 and 6 is facilitated by the pivotally attached ballast rail 106 and further rail 108. In particular, once the second end 103b of the first top rail 102 is mechanically coupled to the second end 105b of the second top rail 104, the ballast rail 106 and the further rail 108 may be unfolded, thereby forming a self-supporting frame structure. Field workers are able to set up two of the self-supporting frame structures shown in FIG. 3a, couple the two self-supporting frame structures one to the other, position the coupled frame members with a predetermined exposure, add ballast elements between the opposing ballast rails to prevent movement of the frame members, mount a solar panel, and attach the deflector element. Since the sub-assemblies merely need to be unfolded and assembled using a small number of rivets or other mechanical fasteners, less skilled labor is required during on-site installation. Further, the ballast elements are positioned substantially centrally such that rows of mounted solar panels may be arranged more closely together than is possible in prior art systems.

Figure 12A:
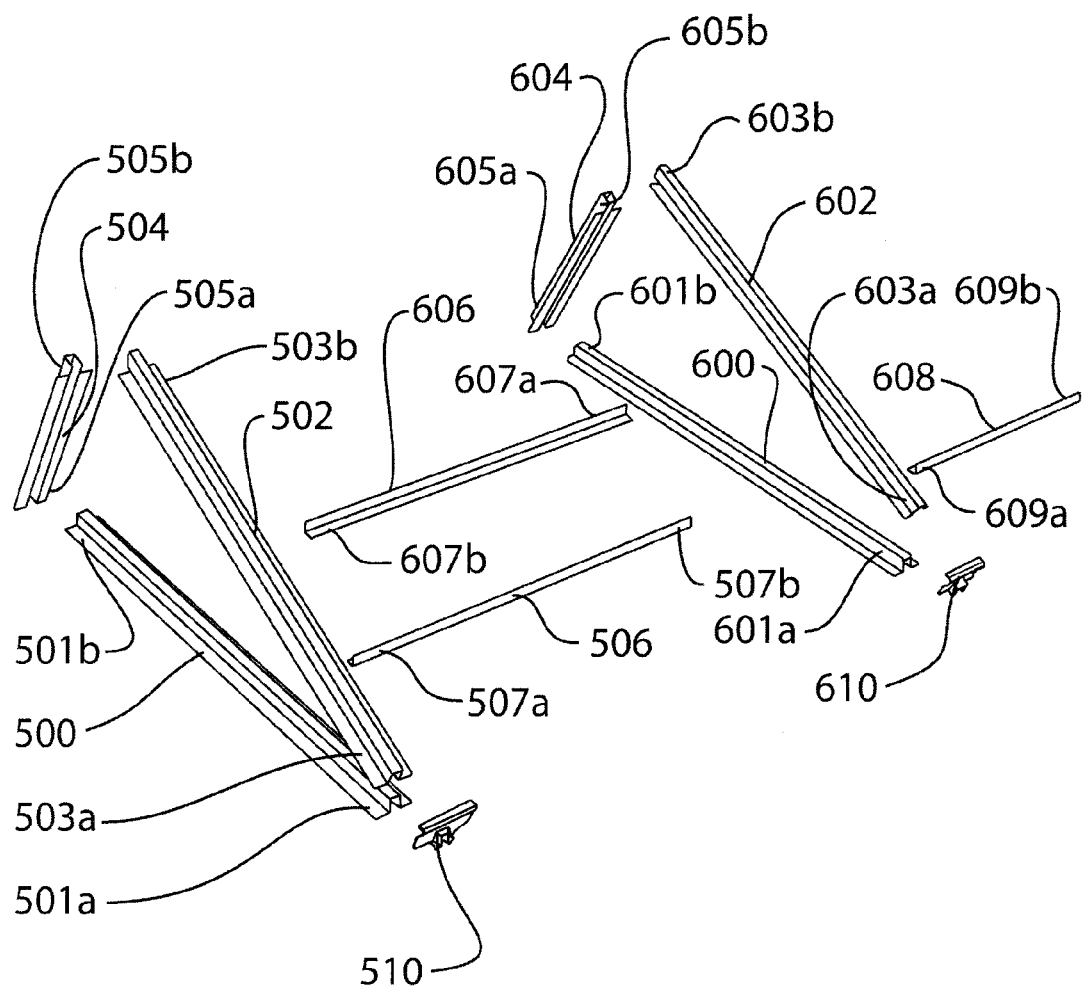
FIG. 12a is an exploded view of a solar panel support system for supporting a solar panel in a landscape orientation, including a west solar panel support sub-assembly and an east solar panel support sub-assembly, according to an embodiment of the instant invention.

Referring now to FIG. 12a, shown is an exploded view of a solar panel support system for supporting a solar panel in a landscape orientation. Unlike the solar panel support system of FIG. 1a, the system that is shown in FIG. 12a comprises non-identical solar panel support sub-assemblies. In particular, the system that is shown in FIG. 12a includes a "west" sub-assembly denoted by reference numerals 5xx, and an "east" sub-assembly denoted by reference numerals 6xx. The labels "west" and "east" denote the orientation of the different sub-assemblies when the solar panel support system is installed on-site at a location in the Northern Hemisphere, such that a solar panel that is supported thereby faces substantially south. Of course, the labels "west" and "east" are reversed when referring to an installation at a location in the Southern Hemisphere, such that a solar panel that is supported thereby faces substantially north.

The "west" sub-assembly comprises: a bottom rail 500 having a first length extending between first and second longitudinally opposite ends thereof, 501a and 501b, respectively; a first top rail 502 having a second length extending between first and second longitudinally opposite ends thereof, 503a and 503b, respectively; and, a second top rail 504 having a third length extending between first and second longitudinally opposite ends thereof, 505a and 505b, respectively. As is shown in FIG. 12a, the third length is shorter than the second length, and the second length is shorter than the first length. Further, a retaining member 510, such as for instance a clip, is provided for supporting a not illustrated solar panel in a mounted configuration adjacent to an upper surface of the first top rail 502.

Figure 12B:
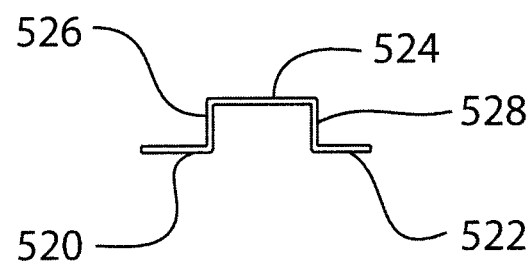

In the instant example, the bottom rail 500, the first top rail 502 and the second top rail 504 are hat-shaped beams. As is shown most clearly in FIG. 12b, each one of the bottom rail 500, the first top rail 502 and the second top rail 504 includes first and second side flanges 520 and 522, respectively, joined to a central flange 524 via first and second webs 526 and 528, respectively. The central flange 524 or the first and second side flanges 520 and 522 provide upper surfaces along the first top rail 502 for supporting a not illustrated solar panel, as described in greater detail in the following sections.

The "west" solar panel support sub-assembly further comprises a ballast rail 506 having a first end 507a and a second end 507b. Ballast rail 506 is generally L-shaped when viewed in a cross section that is taken in a plane normal to the length thereof, and comprises an upright portion for substantially preventing movement of a not illustrated ballast element and a flange extending away from the upright portion, the flange for engaging a lower surface of the not illustrated ballast element.

Referring again to FIG. 12a, the "east" solar panel sub-assembly comprises: a bottom rail 600 having a first length extending between first and second longitudinally opposite ends thereof, 601a and 601b, respectively; a first top rail 602 having a second length extending between first and second longitudinally opposite ends thereof, 603a and 603b, respectively; and, a second top rail 604 having a third length extending between first and second longitudinally opposite ends thereof, 605a and 605b, respectively. As is shown in FIG. 12a, the third length is shorter than the second length, and the second length is shorter than the first length. Further, a retaining member 610, such as for instance a clip, is provided for supporting a not illustrated solar panel in a mounted configuration adjacent to an upper surface of the first top rail 602.

Figure 12C:
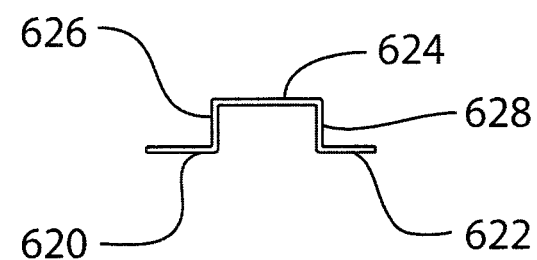

In the instant example, the bottom rail 600, the first top rail 602 and the second top rail 604 are hat-shaped beams. As is shown most clearly in FIG. 12c, each one of the bottom rail 600, the first top rail 602 and the second top rail 604 includes first and second side flanges 620 and 622, respectively, joined to a central flange 624 via first and second webs 626 and 628, respectively. The central flange 624 or the first and second side flanges 620 and 622 provide upper surfaces along the first top rail 602, for supporting a not illustrated solar panel as described in greater detail in the following sections.

Referring again to FIG. 12a, the "east" solar panel support sub-assembly further comprises a ballast rail 606 and a further rail 608. In the instant example, the further rail 608 is a lateral connector rail. The ballast rail 606 has a first end 607a and a second end 607b, and the further rail 608 has a first end 609a and a second end 609b. A length of the ballast rail 106 is longer than a length of the further rail 608, so as to accommodate the spacing requirements of solar panels supported in landscape orientation. Further, ballast rail 606 is generally L-shaped when viewed in a cross section that is taken in a plane normal to the length thereof, and comprises an upright portion for substantially preventing movement of a not illustrated ballast element and a flange extending away from the upright portion, the flange for engaging a lower surface of the not illustrated ballast element. Similarly, by way of a specific and non-limiting example, further rail 608 is generally L-shaped when viewed in a cross section that is taken in a plane normal to the length thereof, and comprises an upright portion and a flange extending away from the upright portion.

Figure 13:
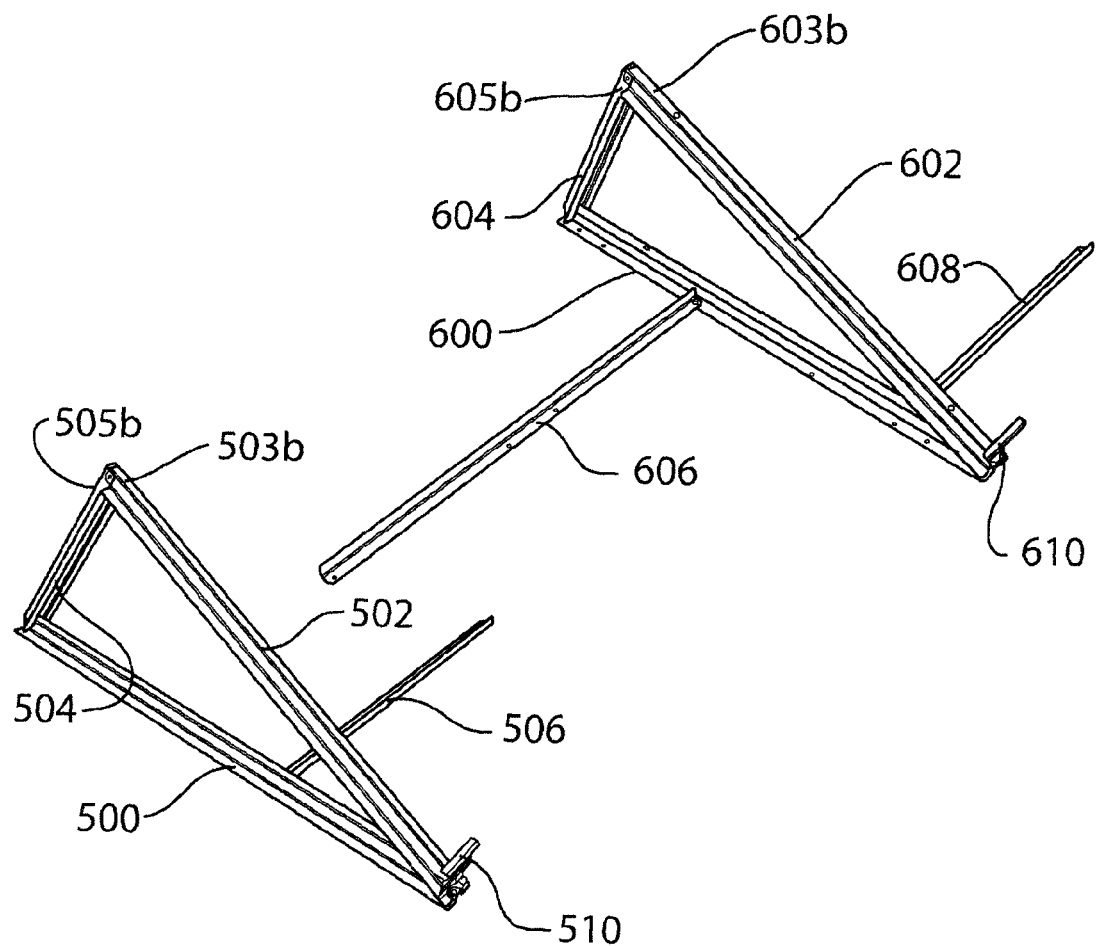
FIG. 13 shows the west and east solar panel support sub-assemblies of FIG. 12a, each in an assembled and fully unfolded condition.

FIG. 13 shows the "west" and "east" solar panel support sub-assemblies of FIG. 12a, each in an assembled and fully unfolded condition. As shown in FIG. 13, the second end 505b of the second top rail 504 is fixedly secured to the second end 503b of the first top rail 502, so as to form a rigid, first triangular-shaped frame. Similarly, the second end 605b of the second top rail 604 is fixedly secured to the second end 603b of the first top rail 602, so as to form a rigid, second triangular-shaped frame.

Ballast rail 506 is pivotally coupled to bottom rail 500, and ballast rail 606 and further rail 608 are each pivotally coupled to bottom rail 600. By way of a specific and non-limiting example, pivotally coupling is performed via a rivet and/or another suitable mechanical fastener. In an embodiment, ballast rail 506, ballast rail 606 and further rail 608 are coupled to a respective bottom rail 500 or 600 in a manner analogous to that described above with reference to FIG. 3b.

As described with reference to FIG. 12a, the first and second top rails 502 and 504 each pivot within a first plane, and the ballast rail 506 pivots within a second plane that is substantially normal to the first plane. Similarly, the first and second top rails 602 and 604 each pivot within a third plane that is substantially parallel to the first plane, and the ballast rail 606 and the further rail 608 each pivot within a fourth plane that is substantially parallel to the second plane.

Figure 14:
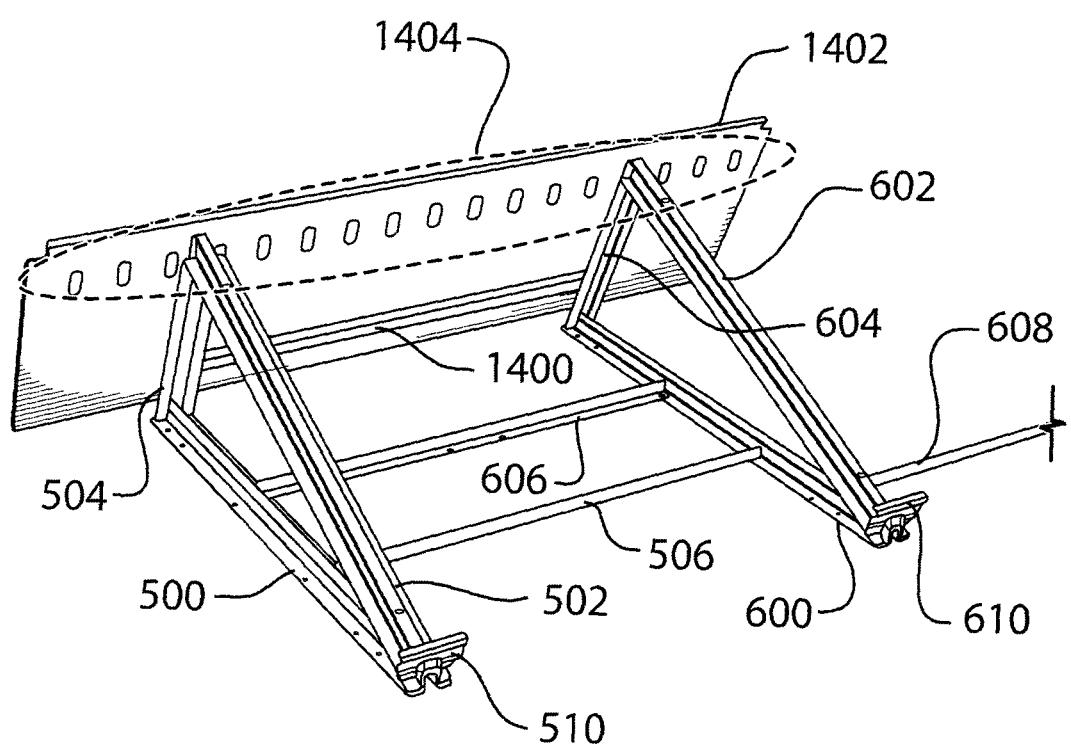
FIG. 14 is a perspective view of a solar panel support system for supporting a solar panel in a landscape orientation, shown without a solar panel installed.

FIG. 14 is a perspective view of a solar panel support system for supporting a solar panel in a landscape orientation, shown without a solar panel installed, in which a "west" solar panel support sub-assemblies and an "east" solar panel support sub-assembly are coupled together. In particular, the ballast rail 506 of the "west" sub-assembly is mechanically coupled to the bottom rail 600 of the "east" sub-assembly, and the ballast rail 606 of the "east" sub-assembly is mechanically coupled to the bottom rail 500 of the "west" sub-assembly. The mechanical coupling is performed, for instance, by riveting as illustrated in FIGS. 7a and 7b. Alternatively, the mechanical coupling is performed using a mechanical latch as shown in FIGS. 8a-8c or 8d-8e.

When the solar panel support system is in the assembled condition as shown in FIG. 14, the ballast rail 506 and the ballast rail 606 cooperate to receive therebetween ballast elements, such as for instance not illustrated 2-inch by 12-inch by 12-inch concrete slabs. The upright portions of the ballast rails 506 and 606 prevent horizontal movement of the ballast elements, whilst the flanges extending from the upright portions of the ballast rails 506 and 606 engage the lower surfaces of the ballast elements.

Referring still to FIG. 14, "west" solar panel support sub-assembly and "east" solar panel support sub-assembly are also coupled together via at least a deflector element 1402 and optionally back rail 1400. In the instant example, the at least a deflector element 1402 is fixedly secured to the second top rail 504 using two rivets and is fixedly secured to the second top rail 604 using two rivets. The at least a deflector element 1402 inhibits air-movement through the solar panel support system, thereby reducing the risk of solar panels being lifted by gusts of wind. A plurality of ventilation structures, such as for instance the plurality of substantially rectangular-shaped openings 1404, optionally is defined within a portion of the at least a deflector element 1402. When a photovoltaic panel is supported on the solar panel sub-assembly, the ventilation structures 1404 make it possible for a flow of air to circulate under the photovoltaic panel and thereby cool the photovoltaic panel, which results in higher efficiency operation of the photovoltaic panel.

Figure 15:
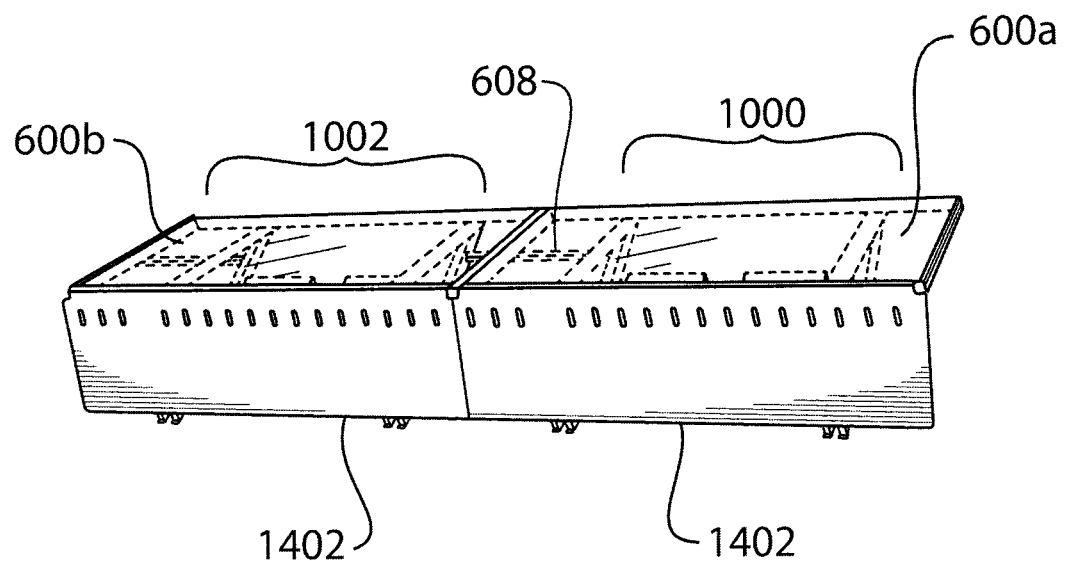
FIG. 15 is a perspective view of an extended solar panel support system, shown with a plurality of solar panels each supported in a landscape orientation.

Referring now to FIG. 15, shown is a rear perspective view of an extended solar panel support system, supporting a plurality of solar panels 600a and 600b each in a landscape orientation. Four solar panel support sub-assemblies, including two "west" sub-assemblies and two "east" sub-assemblies are coupled together. More particularly, a first support sub-unit 1000 is assembled by coupling together "west" and "east" sub-assemblies as described above with reference to FIG. 14, and a second support sub-unit 1002 is assembled by coupling together "west" and "east" sub-assemblies also as described with reference to FIG. 14. Subsequently, the lateral connector rail 608 that is pivotally attached to the bottom rail of the "east" sub-assembly of the first support sub-unit 1000 is mechanically coupled to the bottom rail of the "west" sub-assembly of the second support sub-unit 1002. The mechanical coupling is performed, for instance, by riveting as illustrated in FIGS. 7a and 7b. Alternatively, the mechanical coupling is performed using a mechanical latch as shown in FIGS. 8a-8c or 8d-8e. Deflector elements 1402 are mechanically coupled to the second top rails of each of the first and second support sub-units 1000 and 1002, respectively, such as for instance by riveting. A flange or other retaining mechanism disposed along the top edge of the deflector elements 1402, such as discussed above with reference to FIGS. 6b and 6c, retains the solar panels 600a and 600b.

Figure 10:
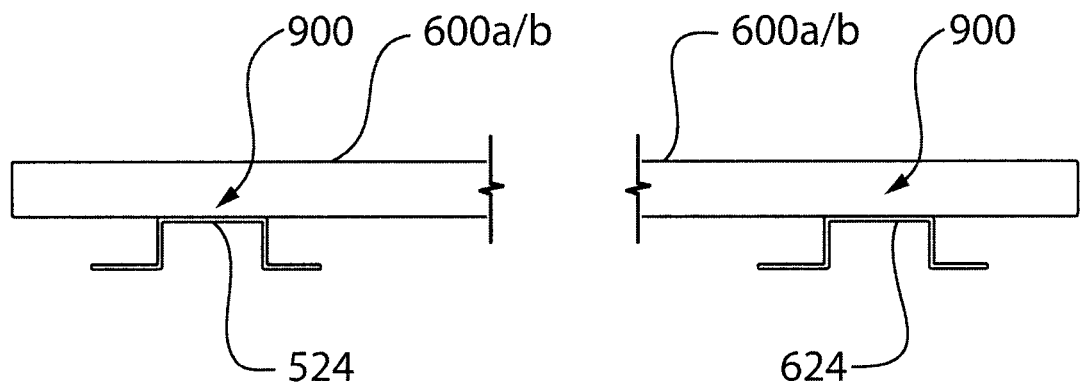
FIG. 10 is a simplified, partial end view showing a solar panel mounted in a landscape orientation adjacent to the first top rails of a solar panel support system according to an embodiment of the instant invention.

Referring also to FIG. 10, the solar panel 600a or 600b is supported in the landscape orientation via ¼ points 900 of the panel 600a/b, which engage the central flange 524 of the first top rail 502 of one "west" sub-assembly, and which engage the central flange 624 of the first top rail 602 of one "east" sub-assembly. The retaining members 510 and 610, which are mounted at the first end of each first top rail 502 and 602, are omitted from FIG. 10 for improved clarity. Lateral movement of the solar panel 600a/b is restricted due to the proximity of the adjacent solar panel 600a/b.

Figure 16A:
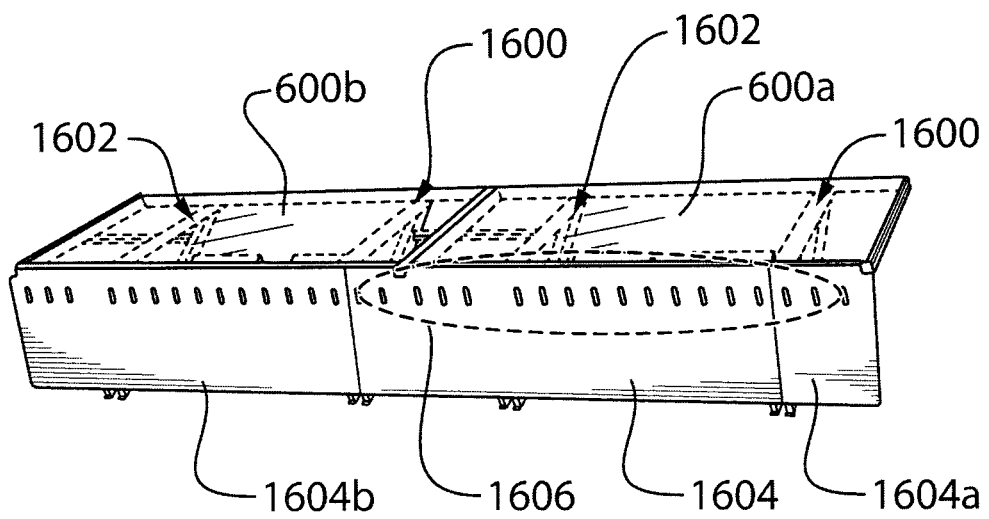
FIG. 16a is a perspective view of another extended solar panel support system, shown with a plurality of solar panels each supported in a landscape orientation.

FIG. 16a is a perspective view of an extended solar panel support system, which is shown supporting a plurality of solar panels 600a and 600b each in a landscape orientation. Four solar panel support sub-assemblies, including two "west" sub-assemblies 1600 and two "east" sub-assemblies 1602, are coupled together in the manner that is described above with reference to FIG. 15. As is shown in FIG. 16a, a deflector element 1604 is mechanically coupled to the second top rail of one of the "west" sub-assemblies 1600 and to the second top rail of one of the "east" sub-assemblies 1602, which two sub-assemblies are cooperatively supporting the solar panel 600a in FIG. 16a. The deflector element 1604 additionally bridges from the one of the "east" sub-assemblies to the other one of the "west" sub-assemblies. At one end of the extended solar panel support system, a deflector element 1604b having a length that is shorter than that of the deflector element 1604 is mechanically coupled to the second top rail of the "west" sub-assembly 1600 and to the second top rail of the "east" sub-assembly 1602, which cooperatively support the last solar panel in the extended system, i.e., solar panel 600b. As shown in FIG. 16a, the deflector element 1604b extends substantially to the "east" terminal edge of the solar panel 1604b. In this way, adjacent pairs of the "west" and "east" sub-assemblies are connected together, thereby providing improved structural stability to the overall support structure.

In one embodiment, the deflector element 1604b is produced by trimming a portion 1604a from a deflector element 1604. The trimmed portion 1604a is mechanically coupled to the second top rail of the "west" sub-assembly that supports solar panel 600a, such that an arrangement of deflector elements extends substantially the entire length of the extended system between the "west" terminal edge of solar panel 600a and the "east" terminal edge of the solar panel 600b.

Figure 16B:
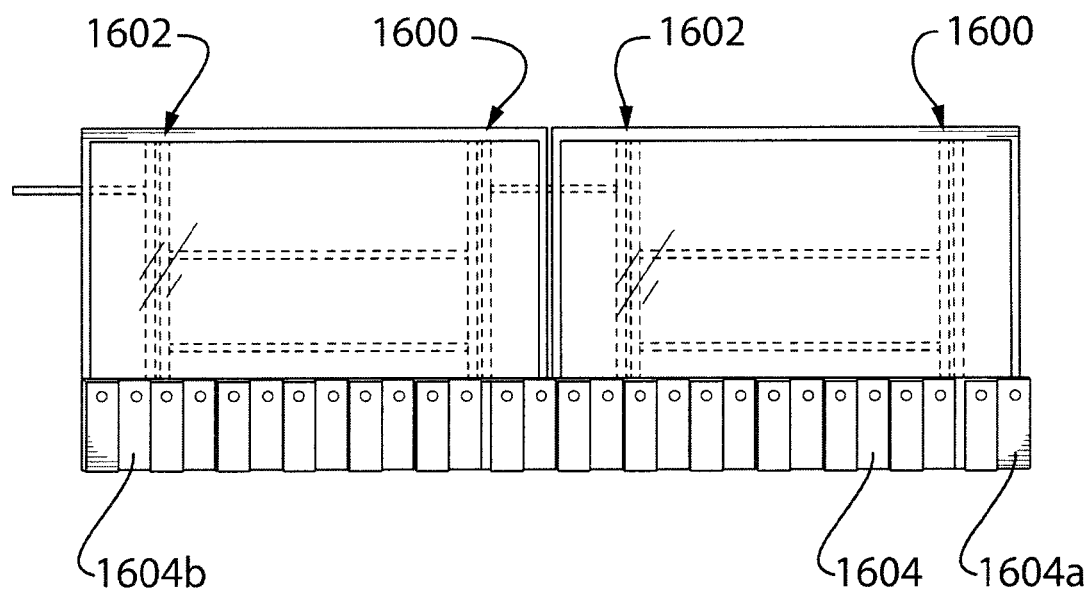
Figure 16C:
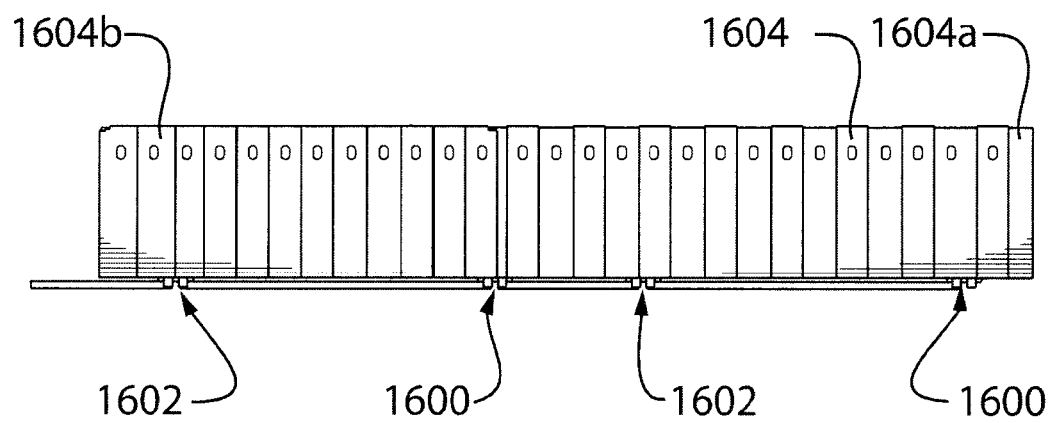

FIGS. 16b and 16c are top and rear views of the system of FIG. 16a, respectively, showing the arrangement of deflector elements extending substantially the entire length of the extended system between the "west" terminal edge of solar panel 600a and the "east" terminal edge of the solar panel 600b.

Referring again to FIG. 16a, a plurality of ventilation structures, such as for instance the plurality of substantially circular openings 1606, optionally is defined within a portion of the deflector element 1604. Similar ventilation structures (not labeled with reference numerals in FIG. 16a) are also shown within portions of the deflector elements 1604a and 1604b. When a photovoltaic panel 600a or 600b is supported on the solar panel sub-assembly, the ventilation structures make it possible for a flow of air to circulate under the photovoltaic panel, and thereby cool the photovoltaic panel, which results in higher efficiency operation of the photovoltaic panel.

Of course, the "west" and "east" sub-assemblies described above also are self-supporting when the ballast rail 506 or 606 and/or the further rail 608 are unfolded, thereby facilitating installation. Further, since the sub-assemblies merely need to be unfolded and assembled using a small number of rivets or other mechanical fasteners, less skilled labor is required during on-site installation. Additionally, the ballast elements are positioned substantially centrally such that rows of mounted solar panels may be arranged more closely together than is possible in prior art systems.

In the embodiments that are described above, hat-shaped rails are used to form the bottom rail, the first top rail and the second top rail of the substantially triangular shaped frame assemblies. Such hat-shaped rails may be stamped or rolled from suitable sheet metal, such as for instance coated steel or aluminum Using a suitable tool, the bottom rail and the first top rail may be produced with a different hat-shaped profile in central region thereof. The hat-shaped profile in the central region is wider than the hat-shaped profile at the end regions. In this way, the same tool may be used to form the bottom rail and the first top rail, and to form the second top rail with a profile that is sufficiently wide to support the nesting-together of the three hat-shaped rails when the solar panel support sub-assembly is in the folded condition. Alternatively, the rails are fabricated using another suitable manufacturing technique such as for instance aluminum extrusion for forming desired rail profiles.

One of skill in the art will recognize that photovoltaic panel installations that are located at different latitudes require different angles of inclination in order to operate at highest efficiency. The angle of inclination is selected during the process of manufacturing the solar panel sub-assemblies, such as by forming the two upper rails of each sub-assembly with relative lengths that result in a desired angle of inclination when the second ends of the two upper rails of each sub-assembly are connected together. The angle of inclination is selected on the basis of a plurality of different factors, which may result in selection of an angle of inclination that deviates substantially from an "ideal" angle of inclination for achieving highest operating efficiency of the supported photovoltaic panels. For instance, shallower angles may be selected for installations at higher latitudes in order to allow adjacent rows of supported photovoltaic panels to be spaced more closely together than would be possible if the "ideal" angle of inclination is selected. In particular, photovoltaic panels that are installed with shallower angles of inclination cast shorter shadows, and therefore may be spaced more closely in front of an adjacent row of photovoltaic panels without blocking the solar radiation. This is possible because using shallower angles at higher latitudes diminishes efficiency by a relatively small amount (i.e. 6%), which may be more than compensated by decreasing the spacing between adjacent rows of supported photovoltaic panels, and consequently increasing the total installed surface area of the photovoltaic panels.

Numerous other embodiments may be envisaged without departing from the scope of the instant invention.

What is claimed is:

1. A solar panel support sub-assembly, comprising:
   a bottom rail having a first length extending between first and second longitudinally opposite ends thereof;
   a first top rail having a second length extending between first and second longitudinally opposite ends thereof, the first end of the first top rail pivotally coupled to the first end of the bottom rail for supporting a pivoting movement of the first top rail between a folded condition and an unfolded condition;
   a second top rail having a third length extending between first and second longitudinally opposite ends thereof, the first end of the second top rail pivotally coupled to the second end of the bottom rail for supporting a pivoting movement of the second top rail between a folded condition and an unfolded condition; and,
   a ballast rail having a first end that is pivotally coupled to the bottom rail at a first location intermediate the first and second longitudinally opposite ends of the bottom rail for supporting a pivoting movement of the ballast rail between a folded condition and an unfolded condition;
   wherein the first and second top rails pivot relative to the bottom rail within a first plane and the ballast rail pivots relative to the bottom rail within a second plane that is normal to the first plane between respective operating and storage positions and wherein, in the respective storage positions, the bottom rail and the first top rail and the second top rail and the ballast rail extend in at least substantially parallel directions for facilitating shipping, storage and handling of the solar panel support sub-assembly.

2. The solar panel support sub-assembly according to claim 1, wherein the first top rail comprises an upper surface for supporting a portion of at least one solar panel.

3. The solar panel support sub-assembly according to claim 2, wherein the bottom rail and first and second top rails are hat-shaped.

4. The solar panel support sub-assembly according to claim 3, wherein the bottom rail and the first and second top rails are disposed in a nested-together stacked-configuration when the first and second top rails are each in the folded condition.

5. The solar panel support sub-assembly according to claim 3, wherein the first top rail comprises first and second side flanges joined to a central flange via first and second webs, respectively.

6. The solar panel support sub-assembly according to claim 2, wherein the second end of the first top rail is fixedly secured to the second end of the second top rail when the solar panel support sub-assembly is in an assembled condition.

7. The solar panel support sub-assembly according to claim 2, comprising a retaining element fixedly secured proximate the first end of the top rail for supporting a lower edge portion of the at least one solar panel.

8. The solar panel support sub-assembly according to claim 2, comprising a further rail having a first end that is pivotally coupled to the bottom rail at a second location intermediate the first and second longitudinally opposite ends of the bottom rail for supporting a pivoting movement of the further rail, within the second plane, between a folded condition and an unfolded condition.

9. The solar panel support sub-assembly according to claim 8, wherein ballast rail is a first ballast rail and the further rail is a second ballast rail.

10. The solar panel support sub-assembly according to claim 9, wherein each one of the first and second ballast rails is L-shaped when viewed in a cross section that is taken in a plane normal to the respective length thereof, each having an upright portion for substantially preventing movement of a ballast element within the second plane and a flange extending away from the upright portion for engaging a lower surface of the ballast element.

11. The solar panel support sub-assembly according to claim 10, wherein a distance along the length of the bottom rail between the first location and the second location is substantially the same as at least one dimension of the ballast element.

12. The solar panel support sub-assembly according to claim 9, wherein a length of the first ballast rail is substantially the same as a length of the second ballast rail.

13. The solar panel support sub-assembly according to claim 9, wherein the first top rail has a first side flange and a second side flange and wherein the upper surface for supporting the portion of the at least one solar panel is an upper surface of at least one of the first and second side flanges.

14. The solar panel support sub-assembly according to claim 8, wherein a length of the ballast rail is greater than a length of the further rail.

15. The solar panel support sub-assembly according to claim 8, wherein the upper surface is an upper surface of the central flange.

16. A solar panel support system, comprising:
a first solar panel support sub-assembly and a second solar panel support sub-assembly, each comprising:
a bottom rail having a first length extending between first and second longitudinally opposite ends thereof;
a first top rail having a second length extending between first and second longitudinally opposite ends thereof, the first end of the first top rail pivotally coupled to the first end of the bottom rail for supporting a pivoting movement of the first top rail between a folded condition and an unfolded condition;
a second top rail having a third length extending between first and second longitudinally opposite ends thereof, the first end of the second top rail pivotally coupled to the second end of the bottom rail for supporting a pivoting movement of the second top rail between a folded condition and an unfolded condition; and,
a ballast rail having a first end that is pivotally coupled to the bottom rail at a location intermediate the first and second longitudinally opposite ends of the bottom rail for supporting a pivoting movement of the ballast rail between a folded condition and an unfolded condition;
wherein the first and second top rails pivot relative to the bottom rail within a first plane and the ballast rail pivots relative to the bottom rail within a second plane that is normal to the first plane between respective operating and storage positions and wherein, in the respective storage positions, the bottom rail and the first top rail and the second top rail and the ballast rail extend in at least substantially parallel directions for facilitating shipping, storage and handling of the solar panel support sub-assembly, and wherein the second end of the first top rail is fixedly secured to the second end of the second top rail when the solar panel support sub-assembly is in an assembled condition, and
wherein, when the solar panel support system is in the assembled condition, the second end of the ballast rail of the first solar panel support sub-assembly is mechanically coupled to the bottom rail of the second solar panel support sub-assembly and the second end of the ballast rail of the second solar panel support sub-assembly is mechanically coupled to the bottom rail of the first solar panel support sub-assembly, said ballast rail of the first solar panel support sub-assembly cooperating with the ballast rail of the second solar panel support sub-assembly for receiving therebetween a ballast element.

17. The solar panel support system according to claim 16, comprising at least one deflector element mechanically coupled to an extending substantially continuously between the second top rail of the first solar panel support sub-assembly and the second top rail of the second solar panel support sub-assembly.

18. A solar panel support system, comprising:
a plurality of solar panel support sub-assemblies, including a first solar panel support sub-assembly, a second solar panel support sub-assembly, and a third solar panel support sub-assembly, each comprising:
a collapsible triangular-shaped frame comprising a bottom rail, a first top rail and a second top rail; and,
a first ballast rail that is pivotally coupled to the bottom rail at a first pivot location; and,
at least one deflector element interconnecting the first and second solar panel support sub-assemblies and interconnecting the first and third solar panel support sub-assemblies,
wherein the first solar panel support sub-assembly comprises a further rail that is pivotally coupled to the bottom rail at a second pivot location, the second pivot location spaced apart from the first pivot location;
wherein the first top rail and the second top rail and the first ballast rail and the further rail are all pivotable relative to the bottom rail between respective operating and storage positions and wherein, in the respective storage positions, the bottom rail and the first top rail and the second top rail and the ballast rail extend in at least substantially parallel directions for facilitating shipping, storage and handling of the solar panel support sub-assembly; and,
wherein, in an assembled condition, a non-pivotally coupled end of the first ballast rail of the first solar panel support sub-assembly is fixedly secured to the bottom rail of the second solar panel support sub-assembly and a non-pivotally coupled end of the further rail of the first solar panel support sub-assembly is fixedly secured to the bottom rail of the third solar panel support sub-assembly, the second and third solar panel support sub-assemblies being disposed one each on opposite sides of the first solar panel support sub-assembly.

19. A method for supporting a solar panel, comprising:
providing a pre-assembled first solar panel support sub-assembly and a pre-assembled second solar panel support sub-assembly, each comprising a bottom rail, a first top rail pivotally coupled to a first end of the bottom rail, a second top rail pivotally coupled to a second end of the bottom rail that is opposite the first end, a first ballast rail pivotally coupled to the bottom rail at a first location intermediate the first and second ends, and the first top rail and the second top rail and the first ballast rail and the bottom rail all extending in at least substantially parallel directions;

fixedly securing a free end of the first top rail to a free end of the second top rail of each of the first and second solar panel support sub-assemblies;

pivoting the first ballast rail of the first solar panel support sub-assembly away from the bottom rail thereof and pivoting the first ballast rail of the second solar panel support sub-assembly away from the bottom rail thereof;

coupling a free end of the first ballast rail of the first solar panel support sub-assembly to the bottom rail of the second solar panel support sub-assembly and coupling a free end of the first ballast rail of the second solar panel support sub-assembly to the bottom rail of the first solar panel support sub-assembly;

positioning a ballast element in contact with at least a portion of the first ballast rail of the first solar panel support sub-assembly and in contact with at least a portion of the first ballast rail of the second solar panel support sub-assembly; and, securing the solar panel adjacent to an upper surface of the first top rail of the first and second solar panel support sub-assemblies.

* * * * *